(12) United States Patent  
Calhoun et al.

(10) Patent No.: US 9,178,518 B2  
(45) Date of Patent: Nov. 3, 2015

(54) SUB-THRESHOLD FPGA AND RELATED CIRCUITS AND METHODS THEREOF

(75) Inventors: Benton H. Calhoun, Charlottesville, VA (US); Joseph F. Ryan, Portland, OR (US)

(73) Assignee: University of Virginia Patent Foundation, Charlottesville, VA (US)

( * ) Notice: Subject to any disclaimer, the term of this patent is extended or adjusted under 35 U.S.C. 154(b) by 52 days.

(21) Appl. No.: 13/635,350

(22) PCT Filed: Mar. 17, 2011

(86) PCT No.: PCT/US2011/028805  
§ 371 (c)(1),  
(2), (4) Date: Sep. 25, 2012

(87) PCT Pub. No.: WO2011/156038  
PCT Pub. Date: Dec. 15, 2011

(65) Prior Publication Data  
US 2013/0009667 A1  Jan. 10, 2013

Related U.S. Application Data

(60) Provisional application No. 61/314,870, filed on Mar. 17, 2010.

(51) Int. Cl.  
*H03K 19/177* (2006.01)

(52) U.S. Cl.  
CPC .... *H03K 19/17744* (2013.01); *H03K 19/17784* (2013.01); *H03K 19/17788* (2013.01)

(58) Field of Classification Search  
CPC .................................................. H03K 19/177  
USPC ........................ 326/39, 40, 41, 44–47, 49, 50  
See application file for complete search history.

(56) References Cited

U.S. PATENT DOCUMENTS 5,682,107 A * 10/1997 Tavana et al. ................... 326/41  
(Continued)

OTHER PUBLICATIONS

S. Jocke, et al. "A 2.6uW Sub-threshold Mixed-signal ECG SoC"; Symposium on VLSI Circuits Digest Technical Papers, 2009, pp. 60-61.

(Continued)

*Primary Examiner* — Daniel D Chang  
(74) *Attorney, Agent, or Firm* — Robert J. Decker; Westerman, Hattori, Daniels & Adrian, LLP

(57) ABSTRACT

A sub-$V_T$ FPGA uses a low swing, dual-$V_{DD}$ interconnect scheme to reduce FPGA area per LUT, delay at a constant energy, and energy at a constant delay relative to a conventional design at low voltage. These improvements are made possible by a custom asynchronous sense amp, a separated voltage for memory cells, and an improved passgate interconnect to optimize routing delay with low energy overhead. This sub-threshold FPGA design enables energy efficient and cost effective configurable logic for a wide variety of ULP applications.

39 Claims, 14 Drawing Sheets

(56) References Cited

U.S. PATENT DOCUMENTS

| | | |
|---|---|---|
| 5,808,942 A | 9/1998 | Sharpe-Geisler |
| 5,850,359 A | 12/1998 | Liu |
| 6,683,818 B1 | 1/2004 | Cornell |
| 7,098,689 B1 | 8/2006 | Tuan |
| 7,135,890 B2 | 11/2006 | Chang |
| 7,378,867 B1 | 5/2008 | Yu |
| 7,549,139 B1 | 6/2009 | Tuan |
| 7,816,947 B1 | 10/2010 | Wang |
| 2004/0174187 A1 | 9/2004 | New |
| 2005/0040851 A1 | 2/2005 | New |
| 2007/0164785 A1 | 7/2007 | He |
| 2008/0180129 A1 | 7/2008 | Nabaa et al. |
| 2009/0261902 A1 | 10/2009 | Midya |
| 2010/0213978 A1* | 8/2010 | Khatri et al. .............. 326/41 |
| 2010/0281448 A1 | 11/2010 | He |

OTHER PUBLICATIONS

B. Zhai, et al. "A 2.60pJ/Inst Subthreshold Sensor Processor for Optimal Energy Efficiency"; Symposium on VLSI Circuits Digest Technical Papers, 2009, pp. 60-61.

Y. Pu, et al. "An Ultra-low Energy/Frame Multi-Standard JPEG Co-processor in 65nm CMOS with Sub/Near Threshold Power Supply", 2009, Session 8, pp. 146-148.

B. Calhoun, et al. "Flexible Circuits and Architectures for Ultralow Power"; Proceedings of the IEEE, vol. 98, No. 2, Feb. 2010, pp. 267-282.

J. Ryan, et al. "Minimizing Offset for Latching Voltage-Mode Sense Amplifiers for Sub-threshold Operation", 9th International Symposium on Quality Electronic Design, 2008, pp. 127-132.

* cited by examiner

= ASA

= Cbit Voltage Terminal

SUB-THRESHOLD FPGA AND RELATED CIRCUITS AND METHODS THEREOF

RELATED APPLICATIONS

This application is a national stage filing of International Application No. PCT/US2011/028805 filed on Mar. 17, 2011, which claims priority under 35 U.S.C. §119(e) from U.S. provisional application Ser. No. 61/314,870, filed on Mar. 17, 2010, entitled "Flexible Circuits and Architecture for Ultra Low Power and Related Method;" the disclosures of which are incorporated herein by reference in their entirety.

GOVERNMENT SUPPORT

This invention was made with Government support under Grant No. W911NF-07-1-0172 awarded by DARPA. The Government has certain rights in this invention.

BACKGROUND OF THE INVENTION

Ultra low power (ULP) miniature devices are enabling a new generation of applications for areas such as healthcare and wireless environmental control. Development of these applications is costly, however, as managing strict resource constraints can lead to high design complexity. For example, many require a significant amount of on-chip processing to extract information locally and thereby reduce the use of power hungry components like radios See S. Jocke, J. Bolus, S. N. Wooters, A. D. Jurik, A. C. Weaver, T. N. Blalock, and B. H. Calhoun, "A 2.6-μW Sub-threshold Mixedsignal ECG SoC," Symposium on VLSI Circuits, 2009, the disclosure of which is hereby incorporated by reference herein in its entirety. The large variety of ULP projects and frequent changes to their requirements make flexibility a desirable attribute in this design space.

Existing approaches fail to provide both flexibility and the desired energy efficiency. Commercial processors and field programmable gate arrays (FPGAs) are far too inefficient for the ULP space, but alternatives using sub-threshold (sub-$V_T$) operation have emerged as an energy efficient alternative. Circuits operating in sub-$V_T$ have $V_{DD}$ levels that are less than the threshold voltage of the transistors in the circuits, $V_T$. Sub-$V_T$ microprocessors have shown very low energy per instruction (See S. Jocke, J. Bolus, S. N. Wooters, A. D. Junk A. C. Weaver, T. N. Blalock, and B. H. Calhoun, "A 2.6-μW Sub-threshold Mixedsignal ECG SoC," Symposium on VLSI Circuits, 2009 and B. Zhai, L. Nazhandali, J. Olson, A. Reeves, M. Minuth, R. Helfand, S. Pant, D. Blaauw, and T. Austin, "A 2.60 pJ/Inst Subthreshold Sensor Processor for Optimal Energy Efficiency," Symposium on VLSI Circuits, 2006, the disclosures of which are hereby incorporated by reference herein in their entirety), but their simple instruction set architecture (ISAs) require many 1000s of instructions to perform significant computing. Sub-$V_T$ ASICs give high efficiency (for example, see Y. Pu, J. P. de Gyvez, H. Corporaal, and Y. Ha, "An Ultra-Low-Energy/Frame Multi-Standard JPEG Co-Processor in 65 nm CMOS with Sub/Near-Threshold Power Supply," ISSCC, 2009, the disclosure of which is hereby incorporated by reference herein in its entirety), but are inflexible and thus expensive to produce for low-volume projects. Today, FPGAs commercially compete mostly in the high performance space. ULP FPGAs could take advantage of a balanced tradeoff between hardware efficiency and flexibility.

SUMMARY OF THE INVENTION

An aspect of an embodiment of the present invention provides a sub-$V_T$ FPGA that uses a low swing, dual-$V_{DD}$ interconnect scheme to reduce FPGA area per LUT, delay at a constant energy, and energy at a constant delay relative to a conventional design at low voltage. These improvements are made possible by, among other things, a custom asynchronous sense amp, a separated voltage for memory cells, and an improved passgate interconnect to optimize routing delay with low energy overhead. This sub-threshold FPGA design enables energy efficient and cost effective configurable logic for a wide variety of ULP applications.

An aspect of an embodiment of the present FPGA invention sets forth, among other things, a design for a sub-$V_T$ FPGA. The global interconnect fabric dominates the energy and delay of commercial FPGAs and the first architecture sub-$V_T$ FPGA. An aspect of an embodiment of the present FPGA invention includes a second architecture sub-$V_T$ FPGA design that, but not limited thereto, uses an architecture with a higher degree of clustering and a novel high-density, low-swing, dual-$V_{DD}$ global interconnect fabric to improve area, energy, and delay. The second architecture is merely one possible embodiment of a ULP FPGA. Likewise, it should be appreciated that the ULP optimizations presented herein are not the exclusive means for implementing this invention's novel improvements, and are not a limitation upon the invention.

Since the global interconnect is costly in energy and delay, an aspect of an embodiment of the present FPGA invention, among other things, increases the utilization of local routing available inside clustered configurable logic blocks (CLBs) to reduce global signal traffic. Since more clustering increases local connections for any given configuration, it reduces the number of hops required on the global fabric, which is helpful to Applicant's low swing circuit approach. Multiple basic logic elements (BLEs) are clustered per CLB and a custom, configurable routing fabric is used to connect all BLEs inside each CLB. Moreover, an aspect of an embodiment of the present FPGA invention provides for the design of a custom toolflow that allows one to program arbitrary configurations onto the new architecture. The second architecture design lowers the burden on the global interconnect fabric due to a reduction of the number of CLBs on the critical path.

To reduce energy and delay on the global interconnect, an aspect of an embodiment of the present FPGA invention provides for the design of a low-swing signaling scheme using single passgate switches. The reduced swing helps to lower switching energy in the highly capacitive interconnect, but it also presents a functionality concern. In sub-$V_T$, the reduced output swing in a passgate network depends on the node's placement in the net (nodes further in the chain suffer a larger drop) and on the total parasitic leakage from every node along the entire net, including those on branching paths. Moreover, an aspect of an embodiment of the present FPGA invention provides for, among other things, the development of a set of custom tools that can quickly compute the delay and energy of an entire placed-and-routed Verilog design (See, for example, FIG. 3) for the second architecture and other designs using a model of the FPGA fabric. The tools allow simulations to be substituted for the analytic model for higher accuracy results. Simulations using these tools show that even very deep nets retain an output swing that is detectable in the initial steep transition region by a sense amplifier (SA). The architecture with higher clustering helps reduce the maximum length of nets, limiting the extent of the voltage droop. However, a need may still exist to detect this lower voltage with a SA.

A synchronous SA scheme essentially pipelines a path, requiring a SA clock with a higher frequency that is a fixed multiple of the system clock to drive SAs in each CLB. Even though the per-net delay for most nets along the path may be short, the longest CLB-to-CLB net on the path will set the period of the SA clock, so imbalanced net lengths lead to extra unnecessary delay by imposing slack on shorter nets. Using asynchronous SAs (ASAs) removes the need for a costly SA clock and allows signals to propagate along each path at their natural pace.

An aspect of an embodiment of the present ASA invention provides for the design of a custom, single ended ASA for Applicant's low swing interconnect. When unused, a SRAM bit (Cbit) places it into a low leakage mode mitigating possible leakage problems. The custom, single ended ASA is faster than a conventional Schmitt trigger (ST) since it trips earlier in the slow transition on the interconnect. One problem with a normal ST is that any nets that settle to low swing voltages near $V_{DD}/2$ will incur large static current. An embodiment of the present ASA invention, however, has on-current peak that occurs at lower input values, so its static current is much smaller than for the ST when the global nets settle to their final values. An embodiment of the present ASA invention has an output (second architecture ASA out) that triggers sharply early in the interconnect transition (second architecture ASA in) and with far less impact of variation.

An advantage of an aspect of an embodiment of the present FPGA invention second architecture's structure is that it decouples the gate voltage of the passgates from $V_{DD}$; the Cbit voltage ($V_{DDc}$) can be set higher than $V_{DD}$ to increase the drive of the passgates without incurring an active energy penalty (except for a small amount of increased active energy resulting from larger voltage swing in the passgate interconnect). The leakage penalty of raising $V_{DDc}$ can be mitigated using circuitry. In sub-$V_T$, voltage is a stronger knob than transistor size, so the dual-$V_{DD}$ nature of Applicant's design gives a strong knob for increasing speed without affecting energy, as shall be shown in the subject disclosure herein.

An embodiment of the present FPGA invention provides for the implementation of a second architecture FPGA array in 90 nm bulk CMOS. Measurements of the test chip confirm proper functionality of the second architecture including ASAs, mini-FPGA CLB, and BLEs.

An aspect of an embodiment of the present invention provides, but not limited thereto, a field programmable gate array (FPGA), wherein the FPGA is configured to operate in a sub-threshold voltage range. Moreover, an aspect of an embodiment may comprise various software tools for programming the FPGA (or at least portions thereof) or simulating the operation of the FPGA (or at least portions thereof). Moreover, an aspect of an embodiment may comprise a method of programming the FPGA (or at least portions thereof) or method of manufacturing the FPGA (or portions thereof). Moreover, an aspect of an embodiment may comprise a method of placing and routing application logic within the FPGA (or at least a portion thereof) or a computer system for routing a circuit in the FPGA (or at least a portion thereof).

An aspect of an embodiment of the present invention provides, but not limited thereto, a field programmable gate array (FPGA), wherein the FPGA is configured to operate in a sub-threshold voltage range. The FPGA may further comprise: a plurality of configurable logic blocks (CLBs) for performing combinational and/or sequential logic operations based on programming of the FPGA in response to one or more logic inputs; a plurality of programmable routing channels configured for interconnecting the CLBs for routing input signals to the CLBs and output signals from the CLBs based on programming of the FPGA; and a plurality of memory cells within the FPGA for configuring logic block operation and signal routing of the programmable routing channels. The programmable routing channels may comprise: wire segments surrounding the CLBs; connection blocks configured for connecting input and output signals of the CLBs with the wire segments; a plurality of state detecting means for detecting state transition of each input signal of the CLBs; and switches for programmably routing logic signals between the connection blocks over the wire segments. Moreover, an aspect of an embodiment may comprise various software tools for programming the FPGA (or at least a portion thereof) or simulating the operation of the FPGA (or at least a portion thereof). Moreover, an aspect of an embodiment may comprise a method of programming the FPGA (or at least a portion thereof) or method of manufacturing the FPGA (or at least a portion thereof). Moreover, an aspect of an embodiment may comprise a method of placing and routing application logic within the FPGA (or at least a portion thereof) or a computer system for routing a circuit in the FPGA (or at least a portion thereof).

An aspect of an embodiment of the present invention provides, but not limited thereto, a field programmable gate array (FPGA), wherein the FPGA may be configured to operate in a sub-threshold voltage range. The FPGA may further comprise: a plurality of configurable logic blocks (CLBs) for performing combinational and/or sequential logic operations based on programming of the FPGA in response to one or more logic inputs, wherein a plurality of state detecting means detect state transition of each input signal of the CLBs. Moreover, an aspect of an embodiment may comprise various software tools for programming the FPGA (or at least a portion thereof) or simulating the operation of the FPGA (or at least a portion thereof). Moreover, an aspect of an embodiment may comprise a method of programming the FPGA (or at least a portion thereof) or method of manufacturing the FPGA (or at least a portion thereof). Moreover, an aspect of an embodiment may comprise a method of placing and routing application logic within the FPGA (or at least a portion thereof) or a computer system for routing a circuit in the FPGA (or at least a portion thereof).

An aspect of an embodiment of the present invention provides, but not limited thereto, a sense amplifier circuit, wherein the amplifier is configured to detect input transitions earlier than a Schmitt trigger would detect the input transitions in an electronic circuit. Moreover, the electronic circuit may comprise: an FPGA; one or more buses; one or more networks on a chip; and one or more on-chip interconnect with switches and low swing signals. Moreover, an aspect of an embodiment may comprise a method manufacturing the sense amplifier circuit (or at least a portion thereof).

An aspect of an embodiment of the present invention provides, but not limited thereto, a sense amplifier circuit, wherein the amplifier is configured to detect rising input transitions before the input voltage reaches half the operating voltage of the input driver and falling input transitions before the input voltage reaches half the operating voltage of the input in an electronic circuit.

These and other objects, along with advantages and features of various aspects of embodiments of the invention disclosed herein, will be made more apparent from the description, drawings and claims that follow.

BRIEF DESCRIPTION OF THE DRAWINGS

The accompanying drawings, which are incorporated into and form a part of the instant specification, illustrate several aspects and embodiments of the present invention and, together with the description herein, serve to explain the principles of the invention. The drawings are provided only for the purpose of illustrating select embodiments of the invention and are not to be construed as limiting the invention.

FIG. 4 includes a path denoted as "a" that shows the disadvantage of how a synchronous sense amp (SA) scheme pipelines a path requiring a SA clock with a higher frequency that is a fixed multiple of the system clock to drive SAs in each CLB. FIG. 4 further includes a path denoted as "b" that shows how using ASAs like an embodiment of the custom ASA removes the need for a costly SA clock and allows signals to propagate along each path at their natural pace.

FIG. 6B schematically shows the symbolic representation of an embodiment of the circuit shown if FIG. 6A.

DETAILED DESCRIPTION OF EXEMPLARY EMBODIMENTS

Figure 1:
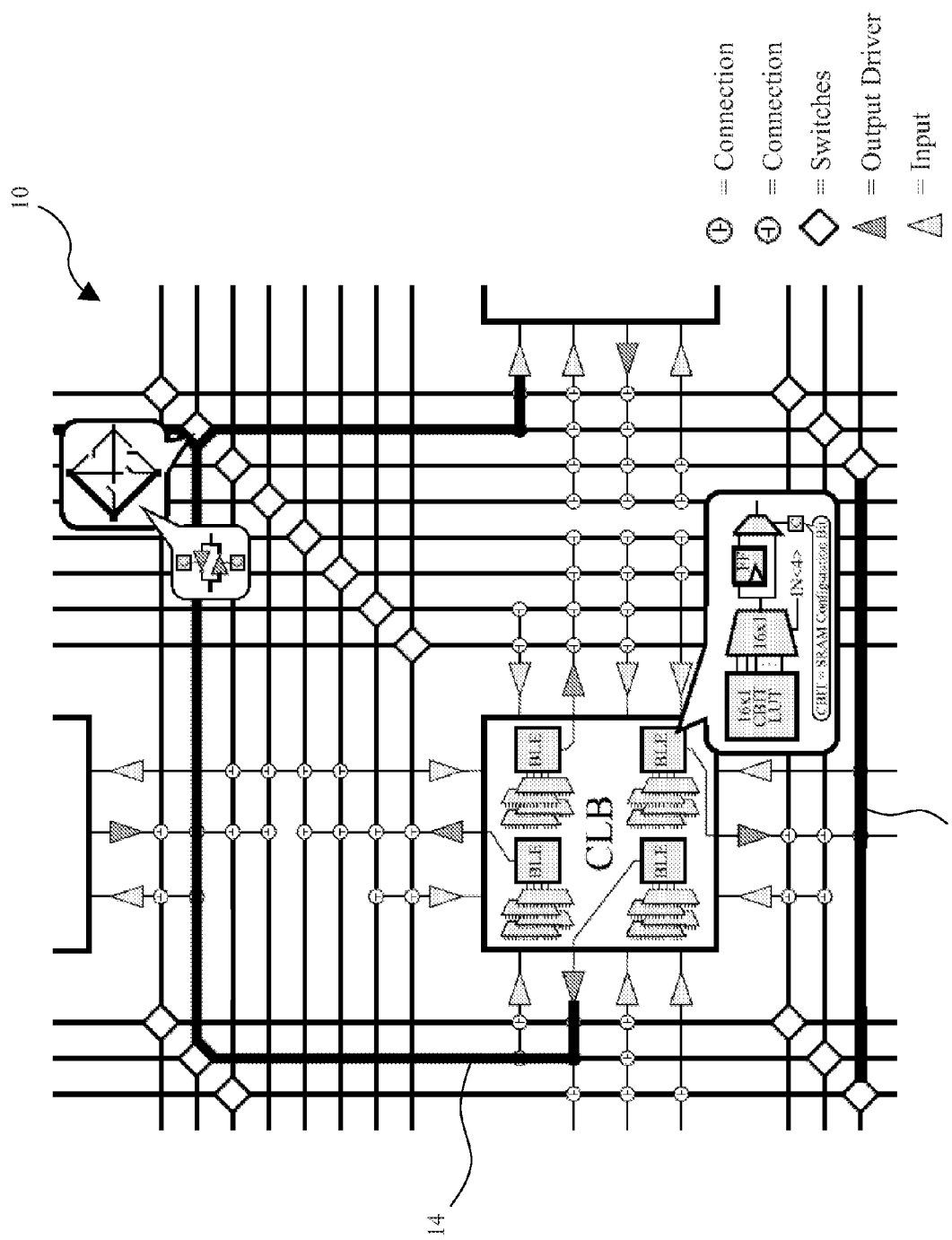
FIG. 1 schematically shows a first architecture, look up table (LUT)-based FPGA architecture with a CLB containing 4 BLEs, each holding a 4-input (16:1) LUT, mux, and flipflop (FF), SRAM bits (Cbits) to configure the connectivity of the CLBs and the interconnect fabric between them to form paths using one or more wire segments and crossbar switch boxes (SBs).

An embodiment of the present FPGA invention sets forth, among other things, a design for a sub-$V_T$ FPGA. FIG. 1 shows a look up table (LUT) based FPGA architecture 10. A CLB contains a cluster of 4 BLEs, each holding a 4-input (16:1) LUT, mux, and flipflop (FF). SRAM bits (Cbits) configure the connectivity of the CLBs and the interconnect fabric between them to form paths. Each interconnect net 14 connects CLBs using one or more wire segments 12 and crossbar switch boxes (SBs). Applicant has previously shown in simulation that mux-based FPGA structures using static CMOS circuits scale to sub-$V_T$ voltages without significant functionality problems; however, tristate buffers are required in every switch box to combat variation. See B. H. Calhoun, J. Ryan, S. Khanna, M. Putic, and J. Lach, "Flexible Circuits and Architectures for Ultra Low Power," Proc. of IEEE, February 2010, the disclosure of which is hereby incorporated by reference herein in its entirety. Applicant previously implemented an embodiment of a first architecture FPGA design (See, for example, FIG. 1) to function in sub-$V_T$ (See B. H. Calhoun, J. Ryan, S. Khanna, M. Putic, and J. Lach, "Flexible Circuits and Architectures for Ultra Low Power," Proc. of IEEE, February 2010,), and Applicant uses that design as a first architecture for comparison purposes. The global interconnect in the first architecture design dominates its energy and delay. An aspect of an embodiment of the present FPGA invention presents a new FPGA design that, among other things, improves area, energy, and delay in sub-$V_T$.

Figure 2A:
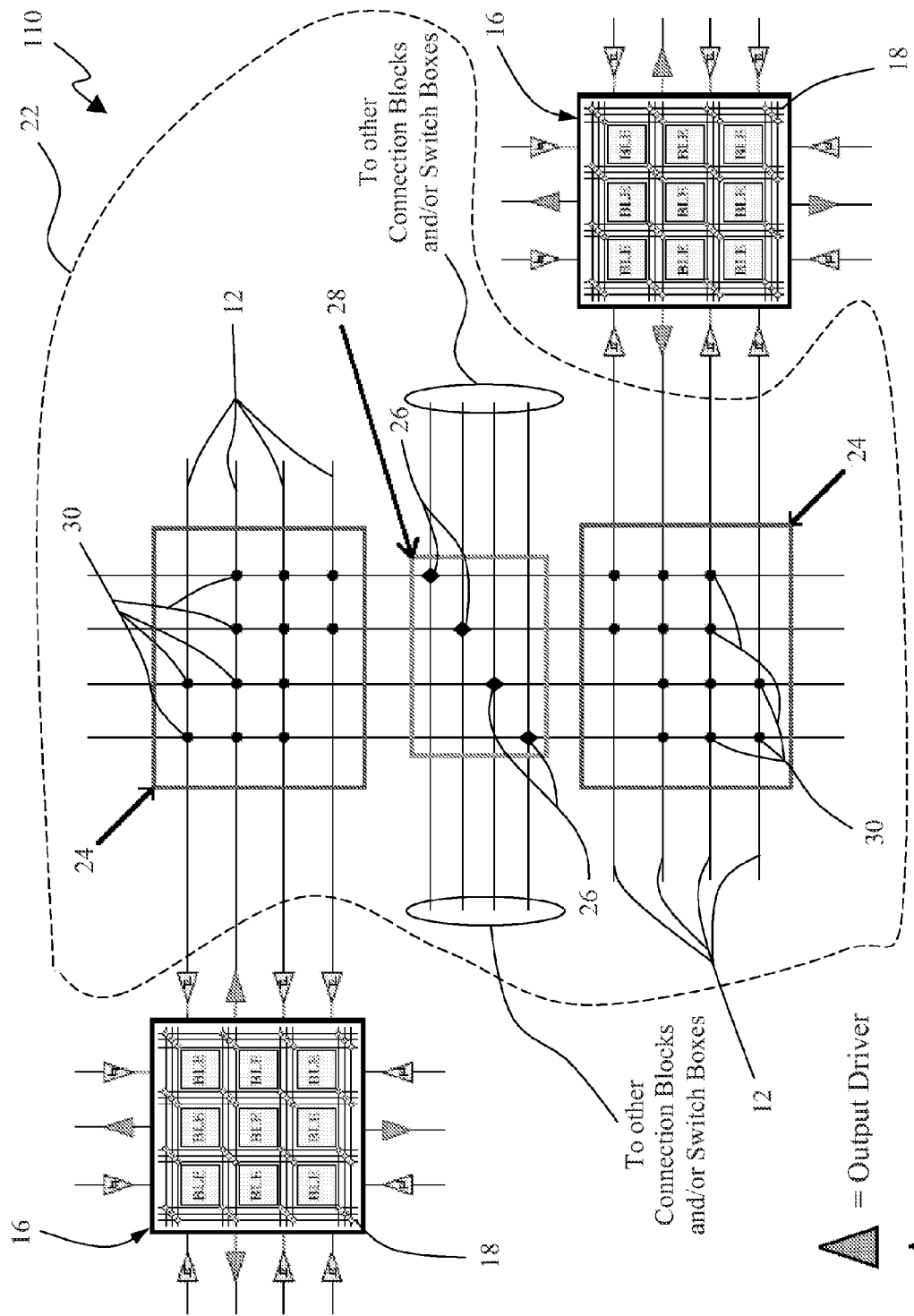
FIG. 2A schematically shows an aspect of an embodiment of a second architecture sub-threshold FPGA.

Referring to FIG. 2A, provided is an aspect of an embodiment of a second architecture sub-threshold FPGA 110. The aspect of the embodiment of the second architecture sub-threshold FPGA 110 may include a plurality of configurable logic blocks (CLBs) 16 for performing combinational and/or sequential logic operations based on programming of the FPGA 110 in response to one or more logic inputs. Also included are a plurality of programmable routing channels (interconnect) 22 configured for interconnecting the CLBs 18 for routing input signals to the CLBs 18 and output signals from the CLBs 18 based on programming of the FPGA 110. As shown in FIG. 2A, the programmable routing channels (interconnect) 22 may, for example, implement a global interconnect connected to a plurality of separate intra-CLBs routing fabrics. The FPGA 110 may include a plurality of memory cells (although not shown) within the FPGA 110 for configuring logic block operation and signal routing of the programmable routing channels 22. The programmable routing channels 22 may comprise: wires or wire segments 12 surrounding the CLBs 16; connection blocks 24 configured for connecting input and output signals of the CLBs 16 with the wire segments 12; a plurality of state detecting means (as denoted as "ASA") for detecting state transition of each input signal of the CLBs 16; and a plurality of output drivers (as denoted "Output Driver") for driving output signals from the CLBs 16; switches 26 (denoted as shaded diamonds in the FIG. 2A) for programmably routing logic signals between the connection blocks 24, each of which may have a plurality of connections 30 on the wires or wire segments 12; and switch boxes 28 comprising a plurality of switches 26 on the wires or wire segments 12.

Sub-$V_T$ FPGA with Low-Swing Global Interconnect

The global interconnect fabric dominates the energy and delay of commercial FPGAs and the first architecture sub-$V_T$ FPGA. Almost 84% of an exemplary embodiment of the first architecture sub-$V_T$ FPGA's delay and 70% of its energy is consumed in the interconnect at 0.4 V. An aspect of an embodiment of the present sub-$V_T$ FPGA design (second architecture) implements an architecture with a higher degree of clustering and a novel high-density, low-swing, dual-$V_{DD}$ global interconnect fabric to improve area, energy, and delay. The second architecture and first architecture are but two possible embodiments of ULP FPGAs. The ULP optimizations in both the first architecture and the second architecture are not the exclusive means for implementing the novel improvements outlined herein, but rather serves merely as an example and is not a limitation upon the invention.

A. Mini-FPGA for Clustering Inside the CLB

Figure 2B:
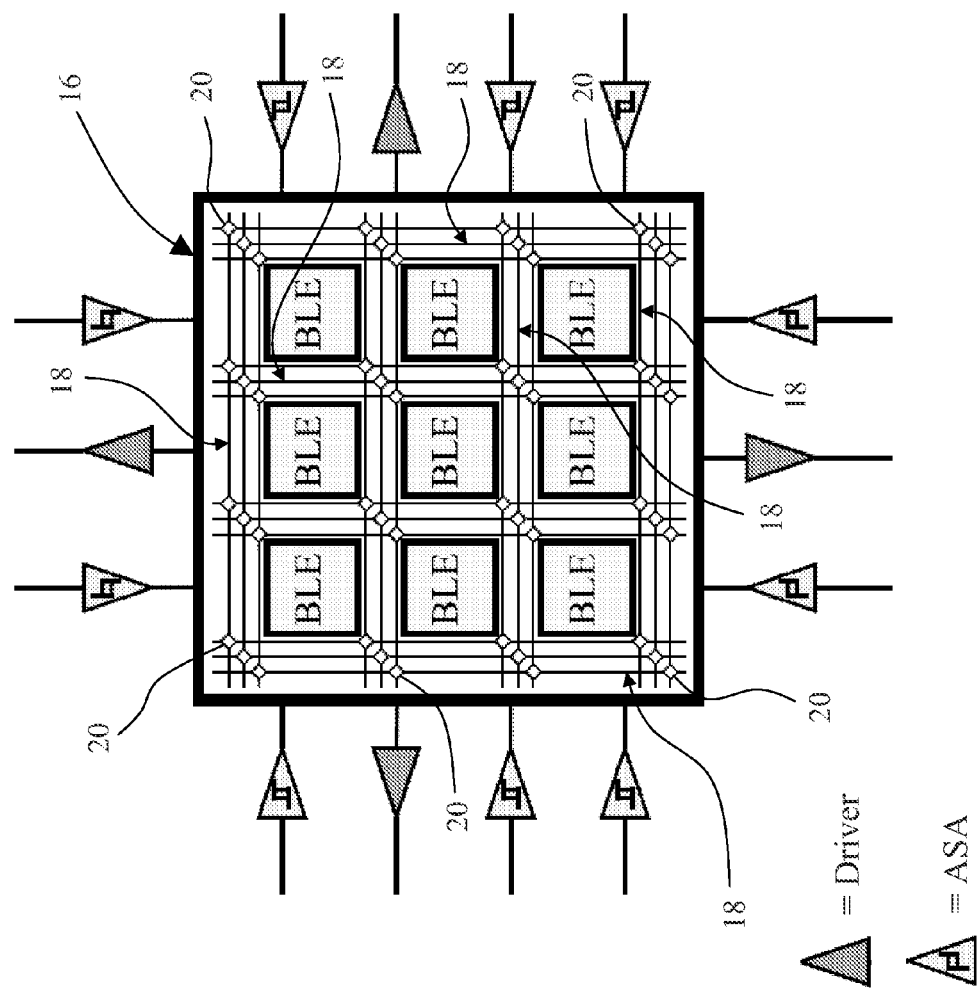
FIG. 2B schematically shows an embodiment of a mini-FPGA using transmission gate SBs for full swing signaling to provide full connectivity with six local channels on the mini-FPGA.
Figure 3:
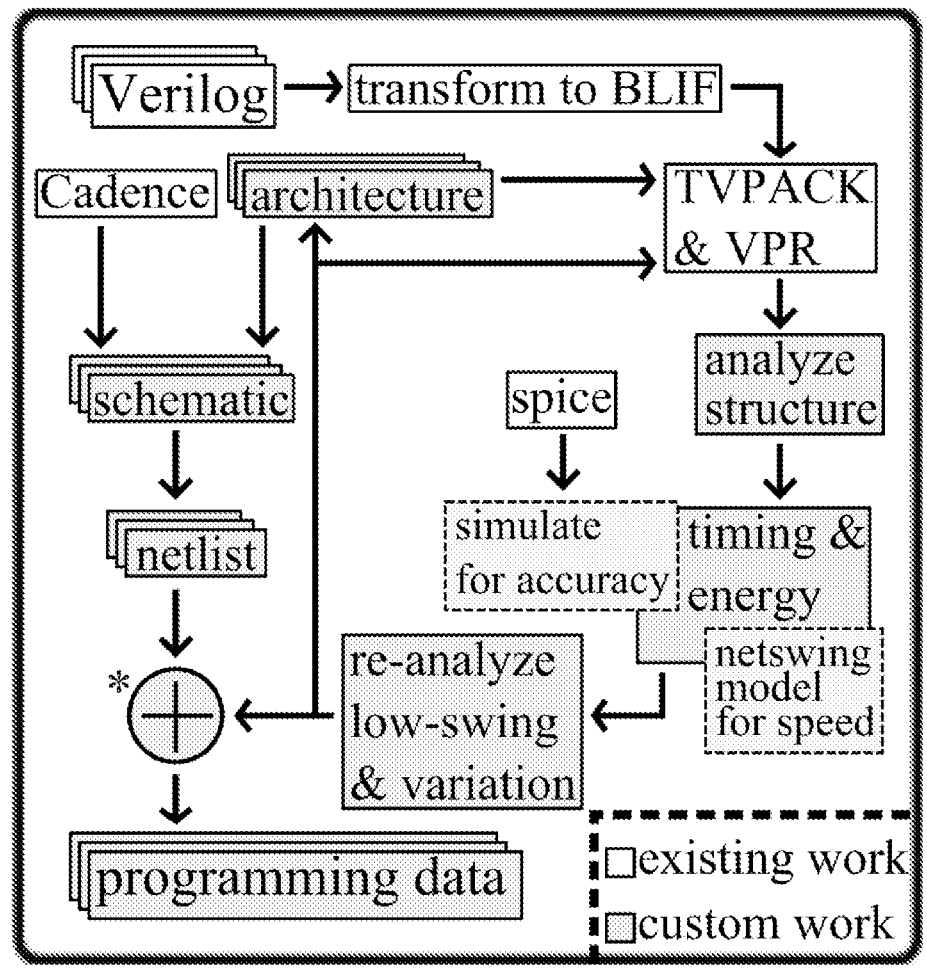
FIG. 3 shows an embodiment of a custom toolflow for programming arbitrary configurations onto an embodiment of Applicant's second architecture FPGA design.

Since the global interconnect is costly in energy and delay, an approach implemented as an embodiment of the present FPGA invention increases the utilization of local routing available inside clustered CLBs to reduce global signal traffic. Clustering more BLEs in each CLB requires extra area for local (e.g. intra-CLB) routing since every combination of BLE inputs, including shared CLB inputs and local BLE outputs, must be routable. Bigger CLBs also stretch global segments' physical length. Since more clustering increases local connections for any given configuration, it reduces the number of hops required on the global fabric, which is helpful to Applicant's low swing circuit approach (to be discussed in the Low-Swing Global Innterconnect Section below). Referring to FIG. 2B, an approach of an embodiment includes a cluster of 9 BLEs per CLB and the use of a "mini-FPGA" 18 configurable routing fabric in the second architecture CLB 16. The mini-FPGA 18 uses transmission gate SBs 20 (denoted as white diamonds in the FIG. 2B) for full swing signaling to provide the same intra-CLB connectivity as the first architecture muxes but with less area. BLEs have full connectivity with six local channels on the mini-FPGA. An embodiment of the present FPGA invention provides for the design of a custom toolflow (See FIG. 3), leveraging publicly available tools (for example, see V. Betz, J. Rose, and A. Marquardt, Architecture and CAD for Deep-Submicron FPGAs, Kluwer, 1999, the disclosure of which is hereby incorporated by reference herein in its entirety), which allows one to program arbitrary configurations onto the new architecture. Over a suite of 43 benchmarks, the second architecture lowers the burden on the global fabric due to a reduction of the number of CLBs on the critical path. The average CLBs/path drops from 7.6 to 6, and its a shrinks from 2.9 to 2.1 across the benchmarks.

B. Low-Swing Global Interconnect

To reduce energy and delay on the global interconnect, an embodiment of the present FPGA invention provides for the design of a low-swing signaling scheme. The bi-directional tristate drivers in the SBs (See FIG. 1) are replaced with single passgate switches, reducing the number of FETs per SB by 3× and the average per-segment total load capacitance by 40%. The second architecture FPGA's passgate interconnect has very different transfer characteristics than the first architecture's buffers. The signal is marked first by a steep initial transition (~0.1V for 0.4V $V_{DD}$, see for example, FIG. 10) and then followed by a very slow tail that does not swing to full $V_{DD}$. The reduced swing helps to lower switching energy in the highly capacitive interconnect, but it also presents a functionality concern. In sub-$V_T$, the reduced output swing in a passgate network depends on the node's placement in the net (nodes further in the chain suffer a larger drop) and on the total parasitic leakage from every node along the entire net, including those on branching paths. An embodiment of the present FPGA invention provides for the development of a set of custom tools that can quickly compute the delay and energy of an entire placed-and-routed Verilog design (See, for example, FIG. 3) for both the second architecture and first architecture designs using a model of the FPGA fabric, similar to the models used for SRAM array design. The tool uses an analytical expression for the transfer characteristics of a passgate in sub-$V_T$ (See, for example, J. F. Ryan and B. H. Calhoun, "Minimizing Offset for Latching Voltage-Mode Sense Amplifiers for Sub-threshold Operation," ISQED, 2008, the disclosure of which is hereby incorporated by reference herein in its entirety), which Applicants applies to a model of the regular structure of the FPGA fabric to compute the swing, delay, and energy of an arbitrary net. The tool also allows full SPICE simulations, using a Monte-Carlo simulation method (or other class of available computational simulating methods) to account for process variations, to be substituted for the analytic model for higher accuracy results. The model gives estimates of the energy and delay in minutes compared with multiple-day SPICE simulations with error rates of only a few percentage points in energy and 10%-20% error in delay. Simulations show that even very deep nets (>50 segments) retain an output swing that is detectable in the initial steep transition region by a SA. An embodiment of the present FPGA invention provides an architecture with higher clustering helps reduce the maximum length of nets, limiting the extent of the voltage droop. However, an embodiment may still need to detect this lower voltage with a SA.

Figure 4:
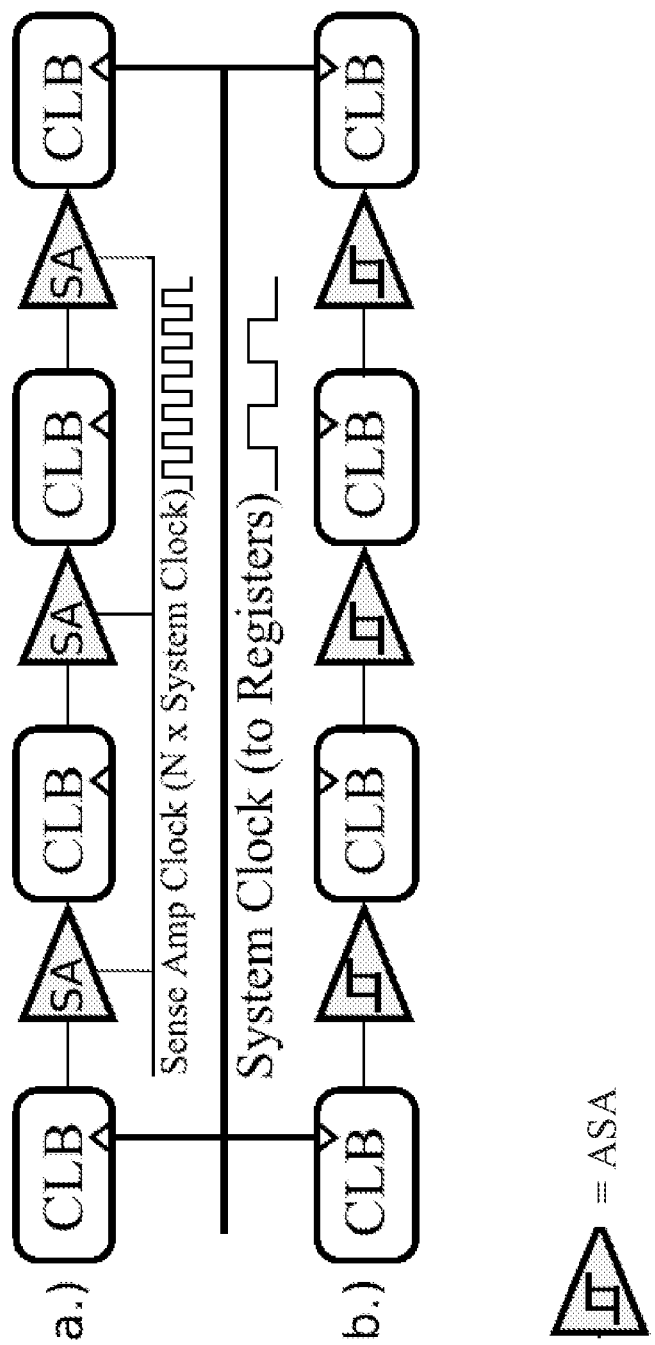
FIG. 4 shows how a logical path on an FPGA can originate at one CLB FF (or pad) and pass across many nets and through many other CLBs before terminating at another FF (or pad).

FIG. 4 shows how a logical path on an FPGA can originate at one CLB FF (or pad) and pass across many nets and through many other CLBs before terminating at another FF (or pad). The system clock is thus set by the length of the longest path. Signals must take several hops on the global interconnect to span this path, which influences the design of the SA. System "(a)" in FIG. 4 shows a synchronous SA scheme. The synchronous SA scheme essentially pipelines a path, requiring a SA clock with a higher frequency that is a fixed multiple of the system clock to drive SAs in each CLB. Even though the per-net delay for most nets along the path may be short, the longest CLB-to-CLB net on the path will set the period of the SA clock, so imbalanced net lengths lead to extra unnecessary delay by imposing slack on shorter nets. Using ASAs removes the need for a costly SA clock and allows signals to propagate along each path at their natural pace (See System "(b)" in FIG. 4). Note that the FPGA remains synchronous with its original clock.

C. Asynchronous Sense Amp (ASA)

Figure 5:
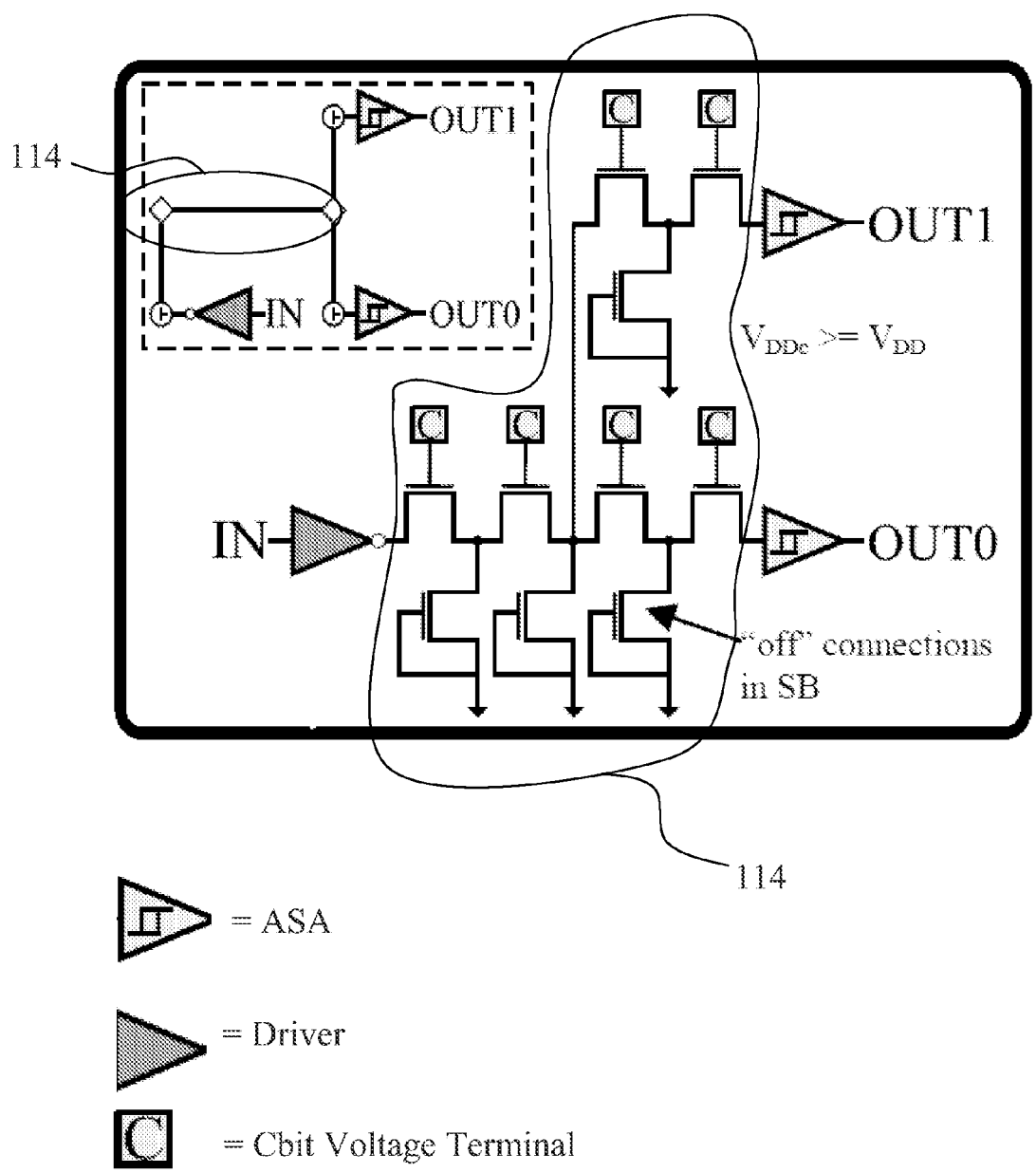
FIG. 5 schematically shows an equivalent circuit for a net, similar to the one highlighted in FIG. 1, using an embodiment of Applicant's custom ASA.

An embodiment of the present ASA invention provides for, but not limited thereto, the design of a single ended ASA for Applicant's low swing interconnect. FIG. 5 shows a circuit for a net 114, similar to the net 14 highlighted in FIG. 1, using the ASA. As shown, the circuit includes input, output, ground terminals, Cbit voltage terminals, two ASAs, and a driver. In this embodiment, an inverter drives the entire net, with the passgate switches inherently limit the swing arriving at the ASAs. The driver can be upsized as needed, as there are few overall drivers compared with SB channel intersections. In contrast, each channel intersection in a SB in the first architecture design has 12 tristates, which must be small for area reasons. An advantage of the second architecture structure (FIG. 5) is that it decouples the gate terminal (which is tied to the Cbit) voltage of the passgates from $V_{DD}$; the Cbit voltage ($V_{DDc}$) can be set higher than $V_{DD}$ to increase the drive of the passgates without incurring an active energy penalty. The leakage penalty of raising $V_{DDc}$ is minor, because, in this particular embodiment, Applicant uses a high-$V_T$ 5T bitcell for Cbits in both the first architecture and second architecture. In sub-$V_T$, voltage is a stronger knob than size, so the dual-$V_{DD}$ nature of Applicant's design gives a strong knob for increasing speed without affecting energy, as Applicant shows later.

Figure 6A:
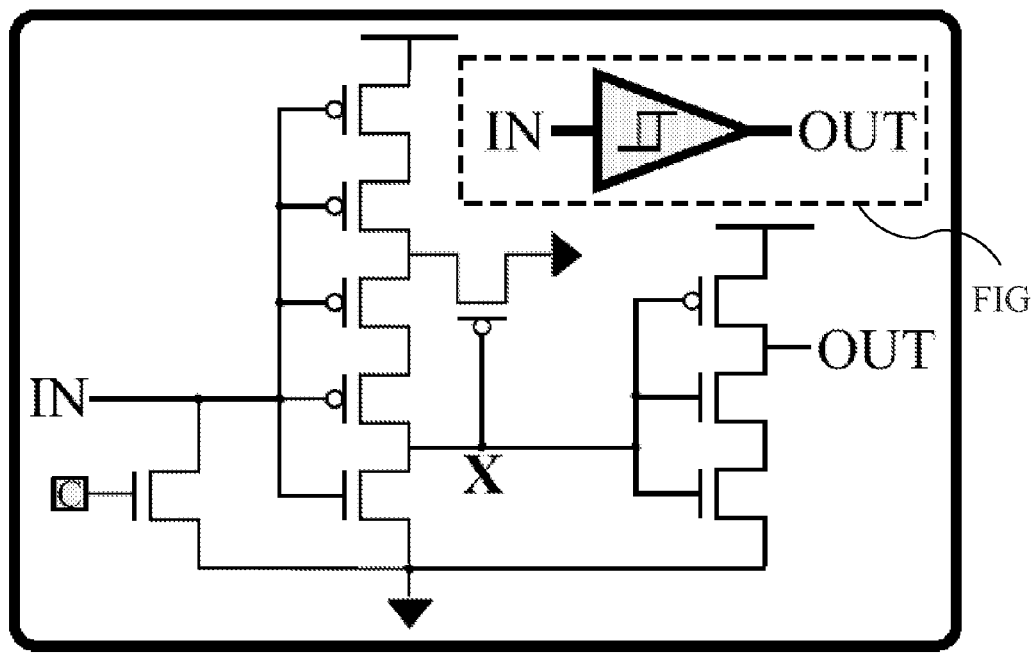
FIG. 6A schematically shows the schematic of an embodiment of Applicant's novel, single ended ASA.
Figure 7:
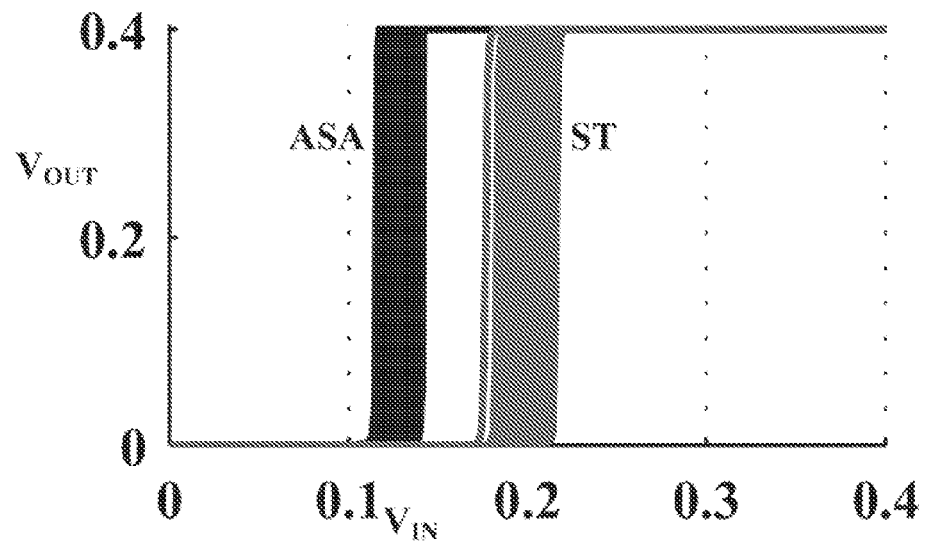
FIG. 7 graphically shows a Monte-Carlo (M-C) simulation of an embodiment of Applicant's custom ASA and ST trip points.
Figure 8:
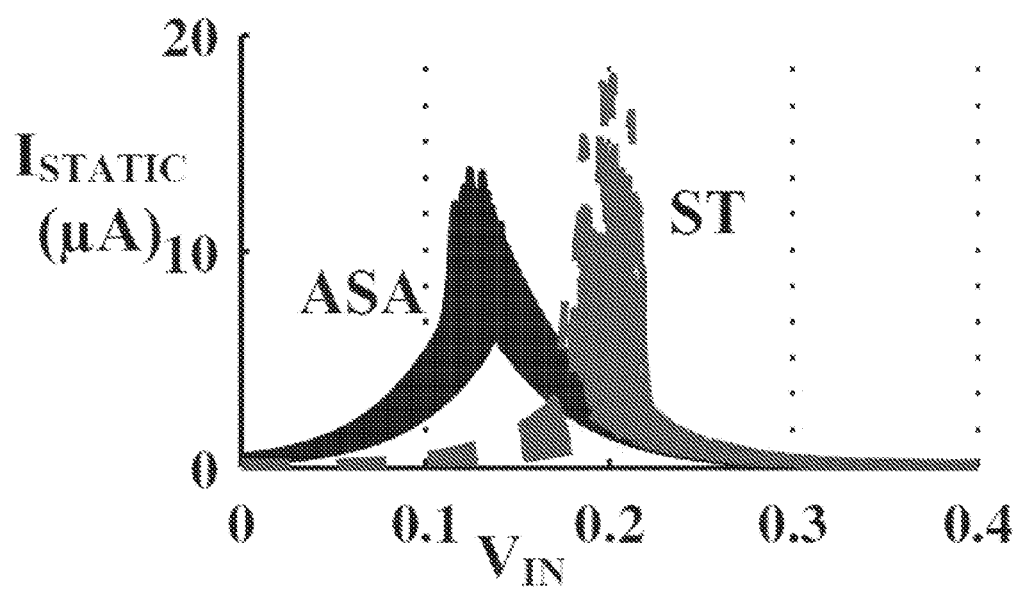
FIG. 8 graphically shows the on-current peak that occurs of an embodiment of Applicant's custom versus that of a typical Schmitt trigger.
Figure 9:
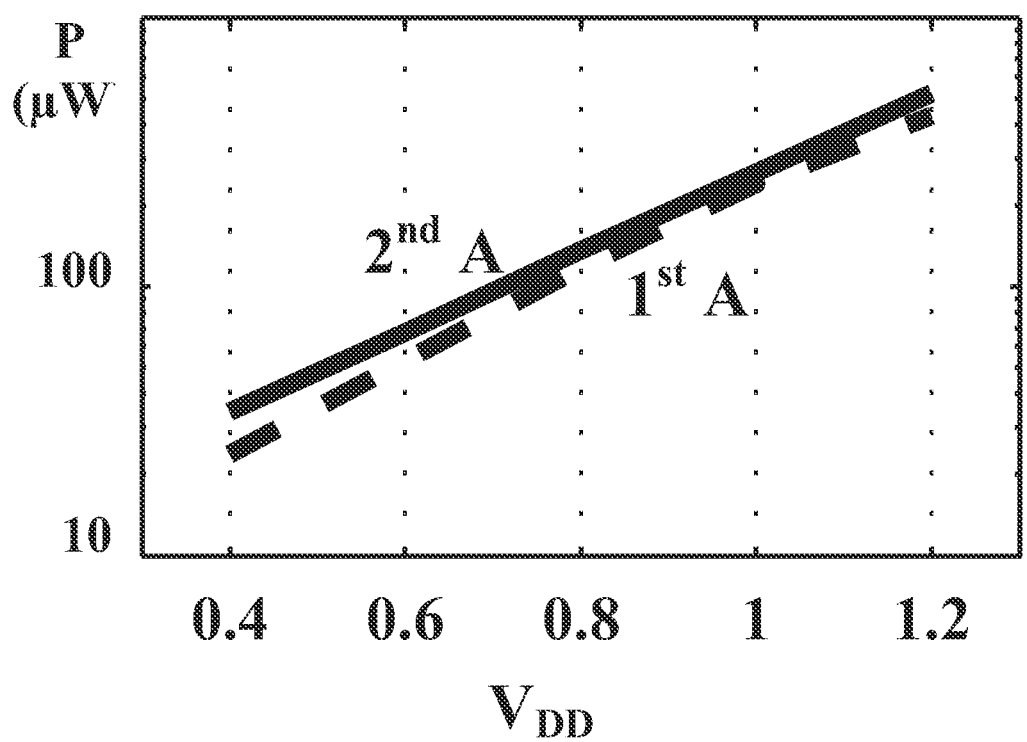
FIG. 9 graphically shows the total leakage (including static current) for one representative benchmark of an embodiment of Applicant's ULP FPGA (780 LUTs).
Figure 10:
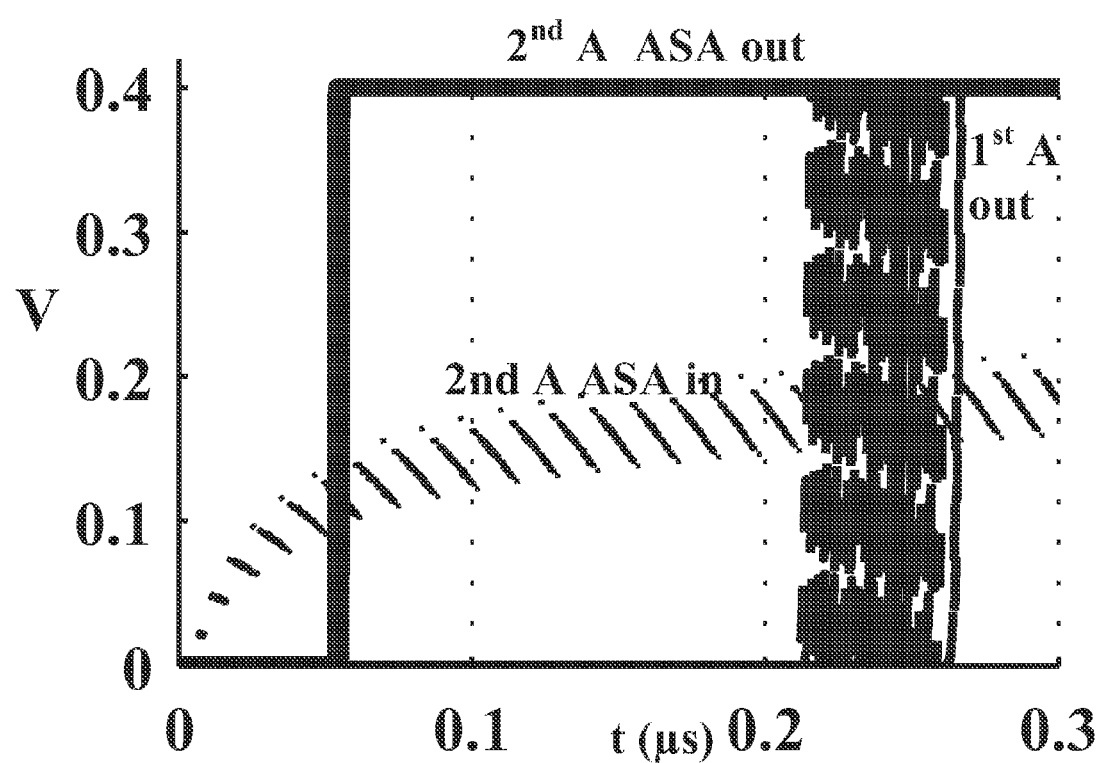
FIG. 10 graphically shows M-C simulation results of one embodiment of Applicant's second architecture ULP FPGA versus a first architecture design of a net that is 10 segments deep with branching loads.

FIG. 6 shows the schematic of an embodiment of Applicant's single ended ASA having a Cbit, input, output, ground terminals, voltage terminals, and intermediate-state-of-signal "X" that is designed to trip earlier in a rising input transition when compared to a Schmitt trigger (ST). When unused, a Cbit places it into a low leakage mode. FIG. 7 shows a Monte-Carlo (M-C) simulation of the ASA and ST trip points. The ASA is faster than the ST since it trips earlier in the slow transition on the interconnect. FIG. 8 shows an additional problem with a normal ST; any nets that settle to low swing voltages near $V_{DD}/2$ will incur large static current. The ASA on-current peak occurs at lower input values, so its static current is much smaller when the global nets settle to their final values. FIG. 9 shows the total leakage (including static current) for one representative benchmark (780 LUTs). The second architecture leakage is slightly higher (40%) at $V_{DD}$=0.4V for the active CLBs. FIG. 10 shows a M-C simulation of one net (10 segments deep, with branching loads). The 10 series tristates from the SBs in the first architecture design create large delay variation due to mismatch, so the first architecture output (denoted as "BC out") is substantially spread in time. The ASA output (denoted as "CC ASA out") triggers sharply early in the interconnect transition (denoted as "CC ASA in") and with far less impact of variation. Referring to the drawings, first architecture is denoted as "$1^{st}$ A" and second architecture is denoted as "$2^{nd}$ A".

Figure 11:
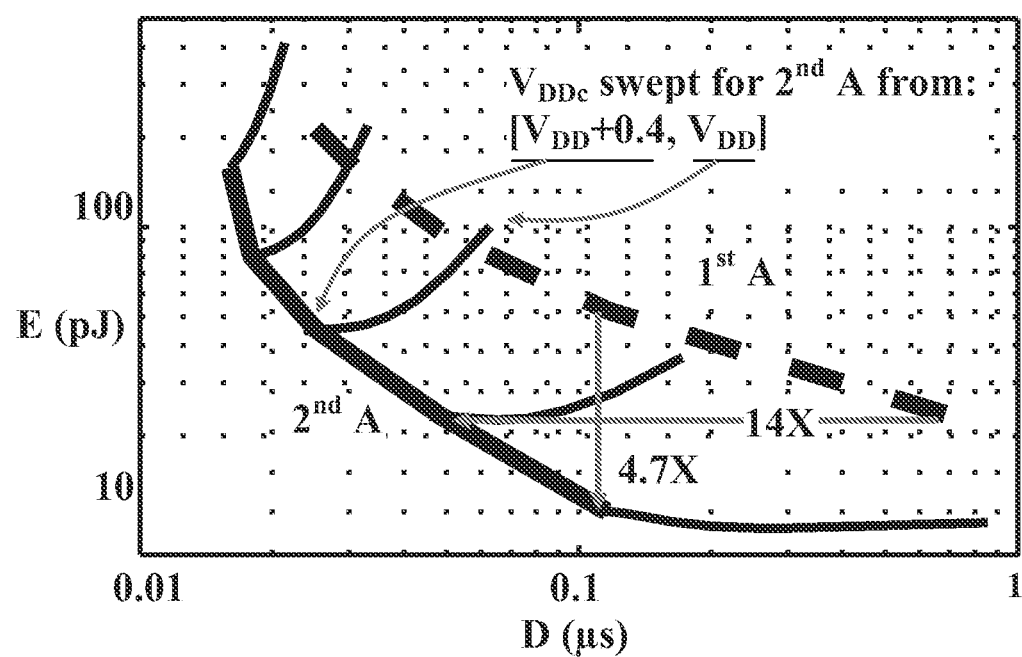
FIG. 11 graphically compares the energy-delay (E-D) curves for an embodiment of the first architecture and an embodiment of the second architecture.

FIG. 11 compares the energy-delay (E-D) curves for the first architecture and second architecture FPGAs at $V_{DD}$=0.4V for a 780 LUT benchmark whose results are typical for the suite of 43 benchmarks. $V_{DDc}$ for the second architecture varies from $V_{DD}$ to $V_{DD}$+0.4V, and the thin lines show how $V_{DDc}$ affects the second architecture's E-D at constant $V_{DD}$. At $V_{DDc}$=$V_{DD}$, the performance of the second architecture is not much different from the first architecture. However, as $V_{DDc}$ is raised, both delay and energy are reduced. The energy savings are due to increased signal swing at the input of the ASA, which speeds up ASA operation and reduces energy consumption resulting from static and leakage current. For example, a final value of approximately 0.2V at the second architecture ASA input translates into a ~5 μA static/leakage draw of the ASA (FIG. 8) as well as significant energy lost by static current during the slow transition. If $V_{DDc}$ is raised by 0.2V, then the new final-time voltage increases to 0.32V, which reduces short-circuit and leakage power, especially if multiple ASAs connect to the same long net. $V_{DDc}$ cannot be raised indefinitely, however; eventually the swing for even the worst-case nets will hit $V_{DD}$.

Figure 12:
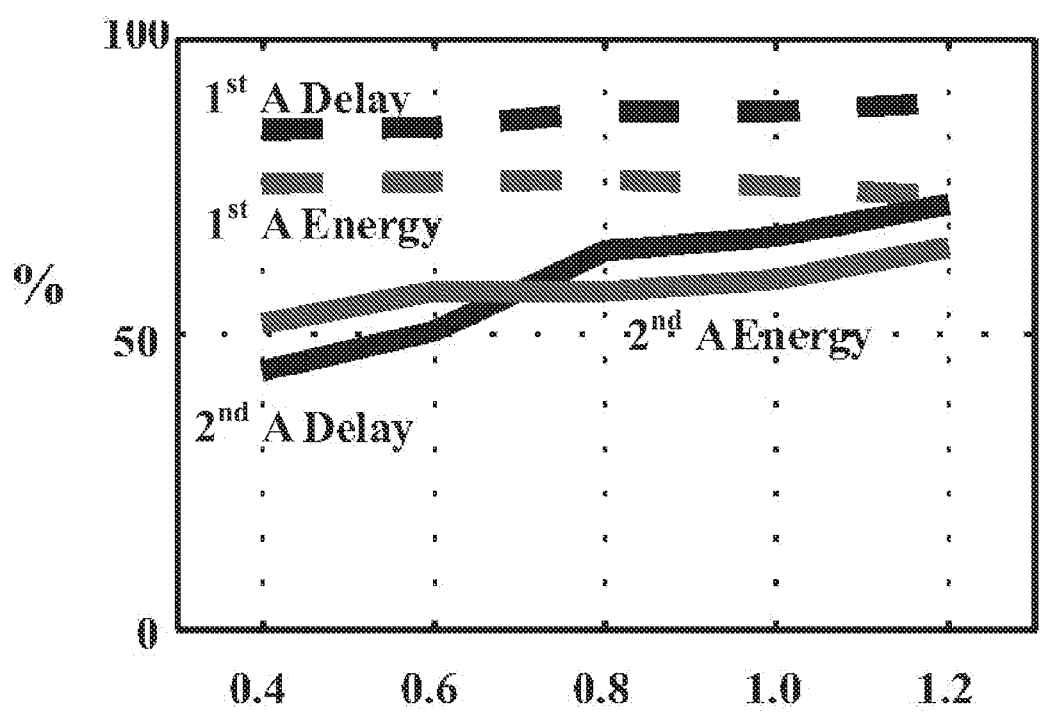
FIG. 12 graphically shows a graph of the percentage of delay and energy attributable to the interconnect in an embodiment of the second architecture and an embodiment of the first architecture.

The savings in sub-$V_T$ are most significant. At constant energy, the second architecture is 14× faster than the first architecture in sub-$V_T$. At constant delay, the second architecture uses 4.7× less energy than the first architecture. The second architecture at $V_{DD}$=0.4V and $V_{DDc}$=0.8V uses 22× (20× average across all benchmarks) less energy than the first architecture at 1.2V with only a 5× delay penalty, which is much less than most sub-$V_T$ designs. FIG. 12 shows that the second architecture gives these improvements by reducing the percentage of energy and delay in the interconnect at low voltage. The CLBs, which use full-swing logic, do not scale differently in proportion to each other.

Test Chip and Measured Results

Figure 13:
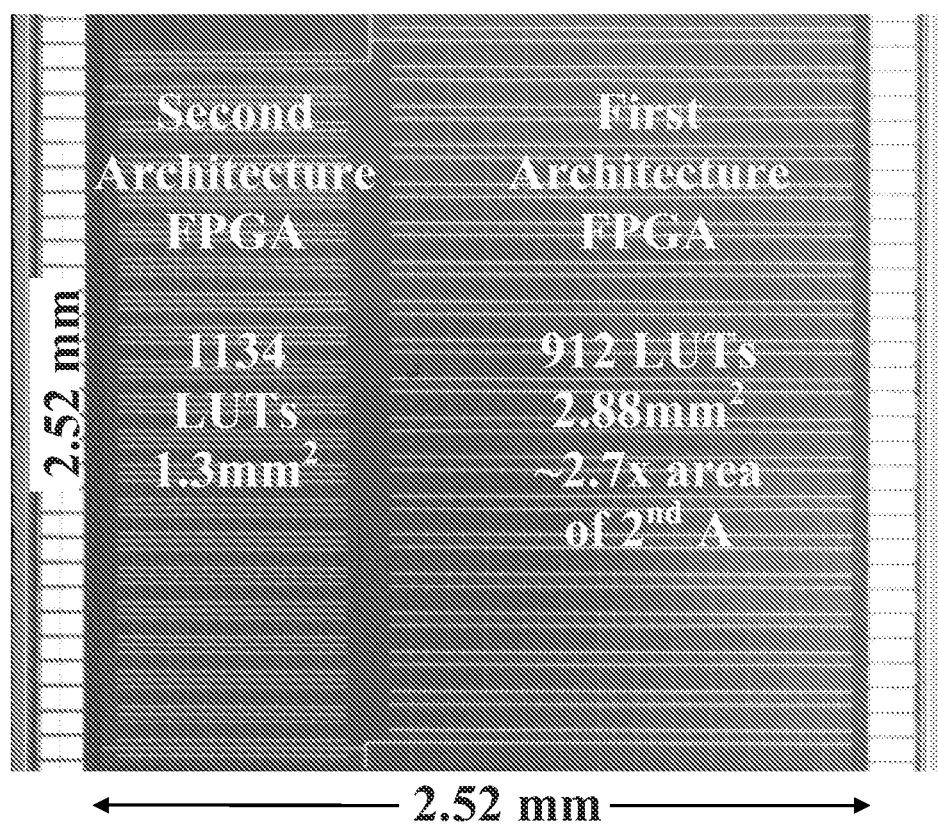
FIG. 13 shows a die photo of and implementation of Applicant's second architecture FPGA array with 1134 LUTs in 90 nm bulk CMOS.
Figure 14:
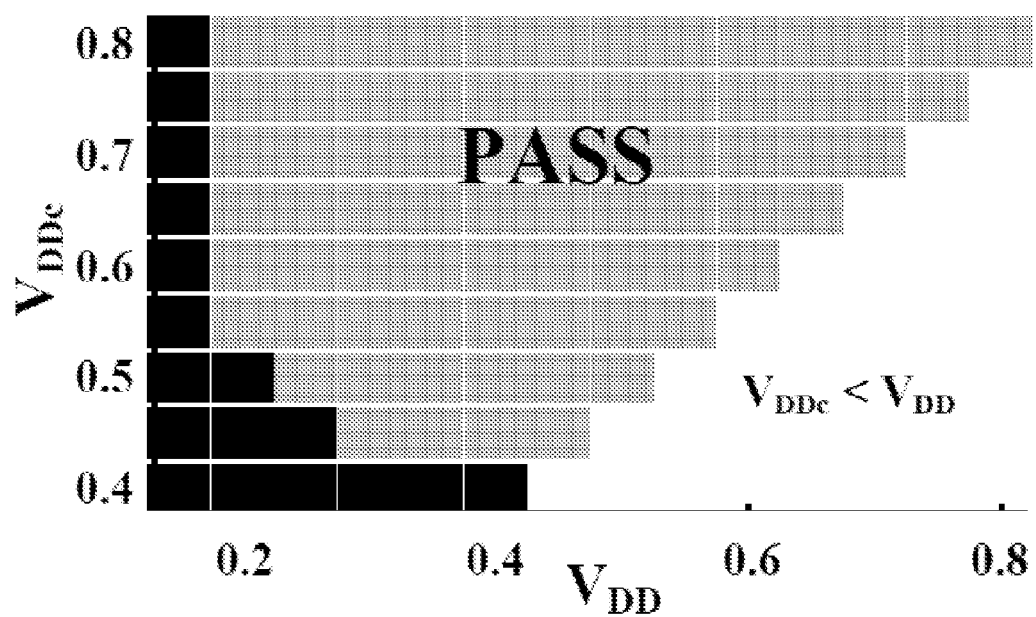
FIG. 14 graphically shows a Shmoo plot of the measured functional range of the second architecture FPGA across $V_{DD}$ and $V_{DDc}$.

An embodiment of the present FPGA invention implements, among other things, a second architecture FPGA array with 1134 LUTs in 90 nm bulk CMOS (FIG. 13, die photo). The array of 6×21CLBs has routing tracks with 36 channels. For direct comparison on the same die, an embodiment of the present FPGA invention implements a 912 LUT (12×19 CLB) first architecture array with 36-track channels. Per LUT, the first architecture's embodiment is 2.7× less area due to the low-swing passgate interconnect. The global interconnect uses 75% of the first architecture's embodiment's area and only 43% of the second architecture's embodiment's area. Measurements of the test chip confirm proper functionality of the second architecture's embodiment including ASAs, mini-FPGA CLB, and BLEs down to $V_{DD}$=0.2V with raised $V_{DDc}$. FIG. 14 shows a Shmoo plot of the functional range of the second architecture FPGA across $V_{DD}$ and $V_{DDc}$. Measured energy and delay curves for a fully programmed benchmark design are pending completion of the automated bitstream mapping from VPR to the physical config bits (marked with * in FIG. 3).

EXAMPLES

Practice of an aspect of an embodiment (or embodiments) of the invention will be still more fully understood from the following examples, which are presented herein for illustration only and should not be construed as limiting the invention in any way.

Example 1 includes field programmable gate array (FPGA), wherein the FPGA is configured to operate in a sub-threshold voltage range.

Example 2 may optionally include at least in part the FPGA of example 1, wherein the FPGA may further comprise:

a plurality of configurable logic blocks (CLBs) for performing combinational and/or sequential logic operations based on programming of the FPGA in response to one or more logic inputs;

a plurality of programmable routing channels configured for interconnecting the CLBs for routing input signals to the CLBs and output signals from the CLBs based on programming of the FPGA; and a plurality of memory cells within the FPGA for configuring logic block operation and signal routing of the programmable routing channels;

wherein the programmable routing channels comprise:
wire segments surrounding the CLBs;
connection blocks configured for connecting input and output signals of the CLBs with the wire segments;
a plurality of state detecting means for detecting state transition of each input signal of the CLBs; and
switches for programmably routing logic signals between the connection blocks over the wire segments.

Example 3 may optionally include at least in part the FPGA of Example 2 (as well as subject matter of one or more of any combination of examples 1-2), wherein at least some of the switches may comprise a passgate transistor.

Example 4 may optionally include at least in part the FPGA of example 3 (as well as subject matter of one or more of any combination of examples 1-3), wherein the passgate transistor comprises:

an NMOS transistor or a PMOS transistor.

Example 5 may optionally include at least in part the FPGA of example 2 (as well as subject matter of one or more of any combination of examples 1-4), wherein the memory cells comprises: SRAM bits, one time programmable fuses and/or non-volatile bits.

Example 6 may optionally include at least in part the FPGA of example 3 (as well as subject matter of one or more of any combination of examples 1-5), wherein the FPGA is driven by system voltages.

Example 7 may optionally include at least in part the FPGA of example 6 (as well as subject matter of one or more of any combination of examples 1-5), wherein the system voltages are variable.

Example 8 may optionally include at least in part the FPGA of example 7 (as well as subject matter of one or more of any combination of examples 1-6), wherein the system voltages comprise:
a first system voltage; and
a second system voltage.

Example 9 may optionally include at least in part the FPGA of example 9 (as well as subject matter of one or more of any combination of examples 1-8), wherein the first system voltage supplies power to the memory cells that drive the gate terminals of the passgate transistors; the second system voltage drives remaining components of the FPGA not driven by the first system voltage.

Example 10 may optionally include at least in part the FPGA of example 9 (as well as subject matter of one or more of any combination of examples 1-8), wherein the remaining components comprises:
low swing drivers;
input drivers for the inter-CLB interconnect segments;
static CMOS logical gates; and/or
pseudo-nMOS logic gates.

Example 11 may optionally include at least in part the FPGA of example 9 (as well as subject matter of one or more of any combination of examples 1-10), wherein the first system voltage is about 0.2 to about 1 Volts. It should be appreciated that other ranges are possible.

Example 12 may optionally include at least in part the FPGA of example 9 (as well as subject matter of one or more of any combination of examples 1-11), wherein the first system voltage is equal to or greater than the second system voltage.

Example 13 may optionally include at least in part the FPGA of example 9 (as well as subject matter of one or more of any combination of examples 1-12), wherein the second system voltage is about 0.2 Volts to about 0.5 volts. It should be appreciated that other ranges are possible.

Example 14 may optionally include at least in part the FPGA of example 9 (as well as subject matter of one or more of any combination of examples 1-13), wherein the second system voltage is below the threshold voltage of transistors not driven by the first system voltage.

Example 15 may optionally include at least in part the FPGA of example 2 (as well as subject matter of one or more of any combination of examples 1-14), wherein each of the CLBs comprise basic logic elements (BLEs), wherein each of the BLEs is connected locally to all other BLEs within the CLB.

Example 16 may optionally include at least in part the FPGA of example 15 (as well as subject matter of one or more of any combination of examples 1-14), wherein the local connection comprises a "mini-FPGA" configurable routing fabric.

Example 17 may optionally include at least in part the FPGA of example 2 (as well as subject matter of one or more of any combination of examples 1-16), wherein at least some of the state detection means comprises an asynchronous sense amplifier.

Example 18 may optionally include at least in part the FPGA of example 2 (as well as subject matter of one or more of any combination of examples 1-17), wherein the asynchronous sense amplifier is clock-less.

Example 19 may optionally include at least in part the FPGA of example 2 (as well as subject matter of one or more of any combination of examples 1-18), wherein at least some of the state detection means comprises a clock-less sense amplifier.

Example 20 may optionally include at least in part the FPGA of example 2 (as well as subject matter of one or more of any combination of examples 1-19), wherein each of the plurality of state detecting means comprises an asynchronous amplifier, wherein the asynchronous amplifier is configured to detect input transitions earlier than a Schmitt trigger would detect the input transitions.

Example 21 may optionally include at least in part the FPGA of example 2 (as well as subject matter of one or more of any combination of examples 1-20), wherein each of the plurality of state detecting means comprises an asynchronous amplifier, wherein the asynchronous amplifier is configured to detect rising input transitions before the input voltage reaches half the operating voltage of the input driver and falling input transitions before the input voltage reaches half the operating voltage of the input driver.

Example 22 may optionally include at least in part the FPGA of example 1 (as well as subject matter of one or more of any combination of examples 1-21), further comprising: a plurality of configurable logic blocks (CLBs) for performing combinational and/or sequential logic operations based on programming of the FPGA in response to one or more logic inputs, wherein a plurality of state detecting means detect state transition of each input signal of the CLBs.

Example 23 may optionally include at least in part the FPGA of example 1 (as well as subject matter of one or more of any combination of examples 1-22), further comprising switches for programmably routing signals in the FPGA, wherein at least some of the switches comprises a passgate transistor.

Example 24 may optionally include at least in part the FPGA of example 1 (as well as subject matter of one or more of any combination of examples 1-23), further comprising: a plurality of memory cells within the FPGA for configuring logic block operation and signal routing of the programmable routing channels.

Example 25 may optionally include at least in part the FPGA of example 24 (as well as subject matter of one or more of any combination of examples 1-24), wherein the passgate transistor comprises an NMOS transistor or a PMOS transistor.

Example 26 may optionally include at least in part the FPGA of example 24 (as well as subject matter of one or more of any combination of examples 1-25), wherein the memory cells comprises SRAM bits and/or non-volatile bits.

Example 27 may optionally include at least in part the FPGA of example 24 (as well as subject matter of one or more of any combination of examples 1-26), wherein the FPGA is driven by system voltages.

Example 28 may optionally include at least in part the FPGA of example 27 (as well as subject matter of one or more of any combination of examples 1-26), wherein the system voltages are variable.

Example 29 may optionally include at least in part the FPGA of example 28 (as well as subject matter of one or more of any combination of examples 1-27), wherein the system voltages comprise: a first system voltage; and a second system voltage.

Example 30 may optionally include at least in part the FPGA of example 29 (as well as subject matter of one or more of any combination of examples 1-28), wherein the first system voltage supplies power to the memory cells that drive the gate terminals of the passgate transistors; the second system voltage drives remaining components of the FPGA not driven by the first system voltage.

Example 31 may optionally include at least in part the FPGA of example 30 (as well as subject matter of one or more of any combination of examples 1-29), wherein the remaining components comprises:
  low swing drivers;
  input drivers for the inter-CLB interconnect segments;
  static CMOS logical gates; and/or
  pseudo-nMOS logic gates.

Example 32 may optionally include at least in part the FPGA of example 30 (as well as subject matter of one or more of any combination of examples 1-31), wherein the first system voltage is about 0.2 to about 1 Volts. It should be appreciated that other ranges are possible.

Example 33 may optionally include at least in part the FPGA of example 30 (as well as subject matter of one or more of any combination of examples 1-32), wherein the first system voltage is equal to or greater than the second system voltage.

Example 34 may optionally include at least in part the FPGA of example 30 (as well as subject matter of one or more of any combination of examples 1-33), wherein the second system voltage is about 0.2 Volts to about 0.5 volts. It should be appreciated that other ranges are possible.

Example 35 may optionally include at least in part the FPGA of example 30 (as well as subject matter of one or more of any combination of examples 1-34), wherein the second system voltage is below the threshold voltage of transistors not driven by the first system voltage.

Example 36 may optionally include at least in part the FPGA of example 22 (as well as subject matter of one or more of any combination of examples 1-35), wherein each of the CLBs comprise basic logic elements (BLEs), wherein each of the BLEs is connected locally to all other BLEs within the CLB.

Example 37 may optionally include at least in part the FPGA of example 36 (as well as subject matter of one or more of any combination of examples 1-35), wherein the local connection comprises a "mini-FPGA" configurable routing fabric.

Example 38 may optionally include at least in part the FPGA of example 22 (as well as subject matter of one or more of any combination of examples 1-37), wherein at least some of the state detection means comprises an asynchronous sense amplifier.

Example 39 includes a sense amplifier circuit, wherein the amplifier is configured to detect input transitions earlier than a Schmitt trigger would detect the input transitions in an electronic circuit.

Example 40 includes a sense amplifier circuit, wherein the amplifier is configured to detect rising input transitions before the input voltage reaches half the operating voltage of the input driver and falling input transitions before the input voltage reaches half the operating voltage of the input in an electronic circuit.

Example 41 may optionally include at least in part the sense amplifier circuit of example 39 (as well as subject matter of one or more of any combination of examples 1-40), wherein the electronic circuit comprises: an FPGA; one or more buses; one or more networks on a chip; and one or more on-chip interconnect with switches and low swing signals.

Example 42 may optionally include software tools for programming at least in part the FPGA of examples 1 or 2 (as well as subject matter of one or more of any combination of examples 1-41).

Example 43 may optionally include a method for programming the FPGA of examples 1 or 2 (as well as subject matter of one or more of any combination of examples 1-42).

Example 44 may optionally include at least in part the method of example 43 (as well as subject matter of one or more of any combination of examples 1-42), wherein the method of programming comprises:
  transforming Verilog or other source code into BLIF;
  performing a placing and routing operation using VPR or a similar tool on the BLIF and architecture components to create a structure;
  analyzing the structure;
  performing timing and energy calculations;
  re-analyzing low-swing and variation aspects of the structure; and
  converting the structure into programming data.

Example 45 may optionally include at least in part the method of method of example 44 (as well as subject matter of one or more of any combination of examples 1-43), further comprising:
  mapping the output of VPR to a physical implementation of the circuit represented by the structure; and
  generating the configuration bitstream for the implementation.

Example 46 may optionally include at least in part the method of example 43 (as well as subject matter of one or more of any combination of examples 1-45), wherein the method of programming comprises:
  transforming Cadence structures and architecture components into a schematic;
  converting the schematic into a netlist; and
  converting the netlist into programming data.

Example 47 may optionally include at least in part the method of example 43 (as well as subject matter of one or more of any combination of examples 1-46), wherein the method of programming comprises:
  transforming Verilog or other source code into BLIF;
  performing the placing and routing operation using VPR or a similar tool on the BLIF and architecture components to create a structure;
  analyzing the structure;
  performing timing and energy calculations;
  re-analyzing low-swing and variation aspects of the structure;
  transforming Cadence structures plus architecture components into a schematic;
  converting the schematic into a netlist; and
  converting the netlist and the structure into programming data.

Example 48 may optionally include at least in part the method of example 47 (as well as subject matter of one or more of any combination of examples 1-46), further comprising:
  mapping the output of VPR to a physical implementation of the circuit represented by the structure; and
  generating the configuration bitstream for the implementation.

Example 49 may optionally include at least in part a method for simulating the operation of the FPGA of examples 1 or 2 (as well as subject matter of one or more of any combination of examples 1-48).

Example 50 may optionally include at least in part the method of example 49 (as well as subject matter of one or more of any combination of examples 1-48), wherein the method of simulating comprises:
  generating a model of the FPGA's fabric; and
  computing swing, delay, and energy of one or more arbitrary nets in the FPGA fabric.

Example 51 may optionally include at least in part the method of example 50 (as well as subject matter of one or more of any combination of examples 1-49), further comprising: using an analytical expression for the transfer characteristics of a passgate in Sub-$V_T$.

Example 52 may optionally include at least in part the method of example 50 (as well as subject matter of one or more of any combination of examples 1-51), further comprising: using SPICE simulations and/or Monte-Carlo.

Example 53 may optionally include at least in part a method of placing and routing application logic within the FPGA fabrics of the FPGAs of examples 1 or 2 (as well as subject matter of one or more of any combination of examples 1-52).

Example 54 may optionally include at least in part the method of example 53, and further comprising the method of any one of examples 44, 46, or 47 (as well as subject matter of one or more of any combination of examples 1-52).

Example 55 may optionally include at least in part a computer system for routing a circuit in the FPGAs of examples 1 or 2 (as well as subject matter of one or more of any combination of examples 1-54), whereby the computer system may comprise:
a path determining module for determining a set of paths in the circuit;
a routing determining module for determining a set of available interconnect resources; and
a path assigning module for assigning each path in the set of paths to at least one of the interconnect resources in the set of available interconnect resources.

Example 56 may optionally include at least in part computer-readable storage medium comprising computer-executable code for routing a circuit in the FPGA of examples 1 or 2 (as well as subject matter of one or more of any combination of examples 1-55), whereby the medium may comprise:
code for determining a set of paths in the circuit;
code for determining a set of available interconnect resources; and code for assigning each path in the set of paths to at least one of the interconnect resources in the set of available interconnect resources.

Example 57 may optionally include at least in part a method of manufacturing the FPGA of any one of examples 1, 2 or 22 (as well as subject matter of one or more of any combination of examples 1-56).

Example 58 may optionally include at least in part the a method of manufacturing the sense amplifier circuit of any one of examples 39, 40 or 41 (as well as subject matter of one or more of any combination of examples 1-57).

Example 59 can include, or can optionally be combined with any portion or combination of any portions of any one or more of Examples 1-58 to include, subject matter that can include means for performing any one or more of the functions of Examples 1-58, or a machine-readable medium including instructions that, when performed by a machine, cause the machine to perform any one or more of the functions of Examples 1-58.

Example 60 can include, or can optionally be combined with any portion or combination of any portions of any one or more of Examples 1-58 to include, subject matter that can include means for performing any one or more of the functions of Examples 1-58, as well devices, systems, structures, components, compositions, materials, shapes, contours, and sizes. Moreover, any of the means discussed throughout examples 1-58 may optionally be performed by any structure, component, device or system discussed throughout this disclosure or any disclosure incorporated by reference herein.

Example 61 can include, or can optionally be combined with any portion or combination of any portions of any one or more of Examples 1-58 to include, subject matter that can include means for manufacturing any one or more of the components, systems, devices, elements, compositions, material, and/or FPGA of Examples 1-58. The subject matter and means may also be provided from the disclosure provided herein, as well as any references incorporated herein by reference.

REFERENCES

The devices, systems, compositions, components, materials, computer program products, and methods of various embodiments of the invention disclosed herein may utilize aspects disclosed in the following references, applications, publications and patents and which are hereby incorporated by reference herein in their entirety:

1. S. Jocke, J. Bolus, S. N. Wooters, A. D. Jurik, A. C. Weaver, T. N. Blalock, and B. H. Calhoun, "A 2.6-µW Sub-threshold Mixedsignal ECG SoC," Symposium on VLSI Circuits, 2009.
2. B. Zhai, L. Nazhandali, J. Olson, A. Reeves, M. Minuth, R. Helfand, S. Pant, D. Blaauw, and T. Austin, "A 2.60 pJ/Inst Subthreshold Sensor Processor for Optimal Energy Efficiency," Symposium on VLSI Circuits, 2006.
3. Y. Pu, J. P. de Gyvez, H. Corporaal, and Y. Ha, "An Ultra-Low-Energy/Frame Multi-Standard JPEG Co-Processor in 65 nm CMOS with Sub/Near-Threshold Power Supply," ISSCC, 2009.
4. B. H. Calhoun, J. Ryan, S. Khanna, M. Putic, and J. Lach, "Flexible Circuits and Architectures for Ultra Low Power," Proc. of IEEE, February 2010.
5. V. Betz, J. Rose, and A. Marquardt, Architecture and CAD for Deep-Submicron FPGAs, Kluwer, 1999.
6. J. F. Ryan and B. H. Calhoun, "Minimizing Offset for Latching Voltage-Mode Sense Amplifiers for Sub-threshold Operation," ISQED, 2008.
7. U.S. Patent Application Publication No. US 2007/0164785 A1, Lei He, "Low-Power FPGA Circuits and Methods", Jul. 19, 2007.
8. U.S. Patent Application Publication No. US2004/0174187 A1, B. New, "FPGA Architecture with Mixed Interconnect Resources Optimized for Fast and Low-Power Routing and Methods of Utilizing the Same", Sep. 9, 2004.
9. U.S. Patent Application Publication No. US 2008/0180129 A1, Nabaa, et al., "FPGA Architecture with Threshold Voltage Compensation and Reduced Leakage", Jul. 31, 2008.
10. U.S. Pat. No. 7,135,890 B2, Chang, A., "SCL Type FPGA with Multi-Threshold Transistors and Method for Forming Same, Nov. 14, 2006.
11. U.S. Pat. No. 7,098,689 B1, Tuan, et al., "Disabling Unused/Inactive Resources in Programmable Logic Devices for Static Power Reduction", Aug. 29, 2006.
12. U.S. Pat. No. 7,549,139 B1, Tuan, et al., "Tuning Programmable Logic Devices for Low-Power Design Implementation", Jun. 16, 2009.
13. U.S. Patent Application Publication No. US 2010/0281448 A1, He, L., "Low-Power FPGA Circuits and Methods", Nov. 4, 2010; U.S. patent application Ser. No. 12/773,686 filed May 4, 2010.
14. U.S. Pat. No. 7,816,947 B1, Wang, "Method and Apparatus for Providing a Non-Volatile Programmable Transistor," Oct. 19, 2010.

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the following claims, including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence or such activities, any particular size, speed, material, dimension or frequency, or any particularly interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

We claim:

1. A field programmable gate array (FPGA), comprising:
   a circuit configured to operate in a sub-threshold voltage range,
   wherein said circuit has a $V_{DD}$ level that is less than a threshold voltage of transistors in said circuit,
   wherein said circuit employs a low-swing signaling scheme, and
   wherein said low-swing signaling scheme is a signaling with a voltage swing that is less than said $V_{DD}$ level.

2. The FPGA of claim 1, further comprising:
   a plurality of configurable logic blocks (CLBs) for performing combinational and/or sequential logic operations based on programming of said FPGA in response to one or more logic inputs;
   a plurality of programmable routing channels configured for interconnecting said CLBs for routing input signals to said CLBs and output signals from said CLBs based on programming of said FPGA; and
   a plurality of memory cells within said FPGA for configuring logic block operation and signal routing of said programmable routing channels;
   wherein said programmable routing channels comprise:
   wire segments surrounding said CLBs;
   connection blocks configured for connecting input and output signals of said CLBs with said wire segments;
   a plurality of state detecting means for detecting state transition of each input signal of said CLBs; and
   switches for programmably routing logic signals between said connection blocks over said wire segments.

3. The FPGA of claim 2, wherein at least some of said switches comprises a passgate transistor.

4. The FPGA of claim 3, wherein said passgate transistor comprises:
   an NMOS transistor or a PMOS transistor.

5. The FPGA of claim 2, wherein said memory cells comprises:
   SRAM bits, one time programmable fuses and/or non-volatile bits.

6. The FPGA of claim 3, wherein said FPGA is driven by system voltages.

7. The FPGA of claim 6, wherein the system voltages are variable.

8. The FPGA of claim 7, wherein said system voltages comprise:
   a first system voltage; and
   a second system voltage.

9. The FPGA of claim 8, wherein said first system voltage supplies power to said memory cells that drive the gate terminals of said passgate transistors; said second system voltage drives remaining components of said FPGA not driven by said first system voltage.

10. The FPGA of claim 9, wherein said remaining components comprises:
    low swing drivers;
    input drivers for the inter-CLB interconnect segments;
    static CMOS logical gates; and/or
    pseudo-nMOS logic gates.

11. The FPGA of claim 9, wherein said first system voltage is about 0.2 to about 1 Volts.

12. The FPGA of claim 9, wherein said first system voltage is equal to or greater than the second system voltage.

13. The FPGA of claim 9, wherein the second system voltage is about 0.2 Volts to about 0.5 volts.

14. The FPGA of claim 9, wherein the second system voltage is below the threshold voltage of transistors not driven by said first system voltage.

15. The FPGA of claim 2, wherein each of said CLBs comprise basic logic elements (BLEs), wherein each of said BLEs is connected locally to all other BLEs within said CLB.

16. The FPGA of claim 15, wherein said local connection comprises a "mini-FPGA" configurable routing fabric.

17. The FPGA of claim 2, wherein at least some of said state detection means comprises an asynchronous sense amplifier.

18. The FPGA of claim 2, wherein said asynchronous sense amplifier is clock-less.

19. The FPGA of claim 2, wherein at least some of said state detection means comprises a clock-less sense amplifier.

20. The FPGA of claim 2, wherein each of said plurality of state detecting means comprises an asynchronous amplifier, wherein said asynchronous amplifier is configured to detect input transitions earlier than a Schmitt trigger would detect said input transitions.

21. The FPGA of claim 2, wherein each of said plurality of state detecting means comprises an asynchronous amplifier, wherein said asynchronous amplifier is configured to detect rising input transitions before the input voltage reaches half the operating voltage of the input driver and falling input transitions before the input voltage reaches half the operating voltage of the input driver.

22. The FPGA of claim 1, further comprising:
a plurality of configurable logic blocks (CLBs) for performing combinational and/or sequential logic operations based on programming of said FPGA in response to one or more logic inputs, wherein a plurality of state detecting means detect state transition of each input signal of said CLBs.

23. The FPGA of claim 22, further comprising switches for programmably routing signals in said FPGA, wherein at least some of said switches comprises a passgate transistor.

24. The FPGA of claim 23, further comprising:
a plurality of memory cells within said FPGA for configuring logic block operation and signal routing of said programmable routing channels.

25. The FPGA of claim 24, wherein said passgate transistor comprises an NMOS transistor or a PMOS transistor.

26. The FPGA of claim 24, wherein said memory cells comprises SRAM bits and/or non-volatile bits.

27. The FPGA of claim 24, wherein said FPGA is driven by system voltages.

28. The FPGA of claim 27, wherein the system voltages are variable.

29. The FPGA of claim 28, wherein said system voltages comprise:
a first system voltage; and
a second system voltage.

30. The FPGA of claim 29, wherein said first system voltage supplies power to said memory cells that drive the gate terminals of said passgate transistors; said second system voltage drives remaining components of said FPGA not driven by said first system voltage.

31. The FPGA of claim 30, wherein said remaining components comprises:
low swing drivers;
input drivers for the inter-CLB interconnect segments;
static CMOS logical gates; and/or
pseudo-nMOS logic gates.

32. The FPGA of claim 30, wherein said first system voltage is about 0.2 to about 1 Volts.

33. The FPGA of claim 30, wherein said first system voltage is equal to or greater than the second system voltage.

34. The FPGA of claim 30, wherein the second system voltage is about 0.2 Volts to about 0.5 volts.

35. The FPGA of claim 30, wherein the second system voltage is below the threshold voltage of transistors not driven by said first system voltage.

36. The FPGA of claim 22, wherein each of said CLBs comprise basic logic elements (BLEs), wherein each of said BLEs is connected locally to all other BLEs within said CLB.

37. The FPGA of claim 36, wherein said local connection comprises a "mini-FPGA" configurable routing fabric.

38. The FPGA of claim 22, wherein at least some of said state detection means comprises an asynchronous sense amplifier.

39. A field programmable gate array (FPGA), comprising:
a circuit configured to operate in a sub-threshold voltage range,
wherein said circuit has a $V_{DD}$ level that is less than a threshold voltage of transistors in said circuit,
wherein said circuit employs a low-swing signaling scheme, and
wherein said circuit employs said low-swing signaling scheme using single passgate switches.

* * * * *